US007390947B2

(12) United States Patent
Majumdar et al.

(10) Patent No.: US 7,390,947 B2
(45) Date of Patent: Jun. 24, 2008

(54) FORMING FIELD EFFECT TRANSISTORS FROM CONDUCTORS

(75) Inventors: Amlan Majumdar, Portland, OR (US); Justin K. Brask, Portland, OR (US); Marko Radosavljevic, Beaverton, OR (US); Suman Datta, Beaverton, OR (US); Brian S. Doyle, Portland, OR (US); Mark L. Doczy, Beaverton, OR (US); Jack Kavalieros, Portland, OR (US); Matthew V. Metz, Hillsboro, OR (US); Robert S. Chau, Beaverton, OR (US); Uday Shah, Portland, OR (US); James Blackwell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 403 days.

(21) Appl. No.: 11/037,512

(22) Filed: Jan. 18, 2005

(65) Prior Publication Data

US 2006/0157747 A1 Jul. 20, 2006

(51) Int. Cl.
*H01L 29/12* (2006.01)

(52) U.S. Cl. ................ 977/938; 977/701; 257/E21.049; 257/E21.27; 257/E51.04

(58) Field of Classification Search ................ 977/938, 977/701; 257/E21.27, E21.049, E51.04
See application file for complete search history.

(56) References Cited

U.S. PATENT DOCUMENTS

| | | | | |
|---|---|---|---|---|
| 5,844,279 | A * | 12/1998 | Tanamoto et al. | 257/347 |
| 2004/0031975 | A1 * | 2/2004 | Kern et al. | 257/213 |
| 2005/0189859 | A1 * | 9/2005 | Tsuruoka et al. | 313/309 |

OTHER PUBLICATIONS

Jarvey et al. "Carbon Nanotube Field-Effect Transistors with Integrated Ohmic Contacts and High-K Gate Dielectrics." Nano Letters (2004; on web Feb. 20, 2004) vol. 4, No. 3, pp. 447-450.*

* cited by examiner

*Primary Examiner*—Matthew C. Landau
*Assistant Examiner*—Michael Durbin
(74) *Attorney, Agent, or Firm*—Trop, Pruner & Hu, P.C.

(57) ABSTRACT

A nanotube transistor, such as a carbon nanotube transistor, may be formed with a top gate electrode and a spaced source and drain. Conduction along the transistor from source to drain is controlled by the gate electrode. Underlying the gate electrode are at least two nanotubes. In some embodiments, the substrate may act as a back gate.

4 Claims, 5 Drawing Sheets

FORMING FIELD EFFECT TRANSISTORS FROM CONDUCTORS

BACKGROUND

This invention relates generally to field effect transistors and, particularly, to such transistors using nanotubes, such as carbon nanotubes.

Carbon nanotubes are graphene cylinders whose ends are closed by caps, including pentagonal rings. The nanotube is a hexagonal network of carbon atoms forming a seamless cylinder. These cylinders can be as little as a nanometer in diameter with lengths of tens of microns, in some cases. Depending on how they are made, the tubes can be multiple walled or single walled.

The drive current that is possible with a carbon nanotube transistor is insufficient for conventional logic applications. There are a number of reasons for this, including the fact that the drive current is too small for most logic circuit applications. While the drive current per unit width for carbon nanotube transistors may be high, due to the nano scale diameter of carbon nanotubes, the absolute current level is still not large enough for most logic applications.

Thus, there is a need for better ways to make carbon nanotube and other nanotube transistors.

DETAILED DESCRIPTION

Figure 1:
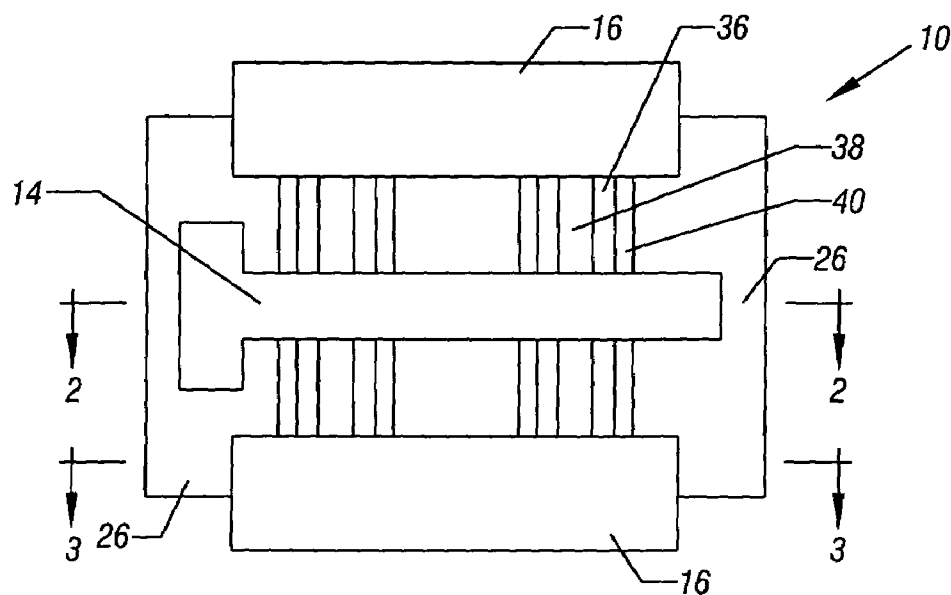
FIG. 1 is a greatly enlarged, top plan view of one embodiment of the present invention.

Referring to FIG. 1, a nanotube transistor 10 may include two nanotubes (not shown), but more nanotubes may be used in some embodiments. Basically, the more nanotubes that are used in the array, the higher the current carrying capacity of the transistor and the higher its drive currents. Higher drive currents would make the device 10 more suitable for logic applications.

In FIG. 1, the source/drain metal pad 16 is provided on either side of a metal gate electrode 14. A semiconductor substrate (not shown) may be covered with a high dielectric constant material 26. The dielectric material 26 may be any dielectric material.

Figure 2:
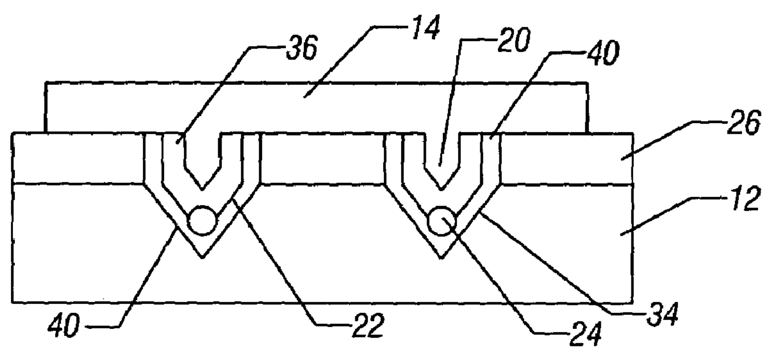
FIG. 2 is a cross-sectional view taken generally along the line 2-2 in FIG. 1.

Referring to FIG. 2, underneath the metal gate electrode 14 is a semiconductor substrate 12 covered by the high dielectric constant dielectric 26. A pair of V-grooves 34 are formed in the substrate 12. Each V-groove 34 holds a carbon nanotube 24. The carbon nanotubes 24 sit over another high dielectric constant layer 40 that is deposited over the V-groove 34. The layer 36, which is a high dielectric constant material, is located over the top of the carbon nanotubes 24 in each V-groove 34. Layer 36, which acts as the front gate oxide, may be thin in order to obtain high gate capacitance, and hence, high transistor drive current.

Figure 3:
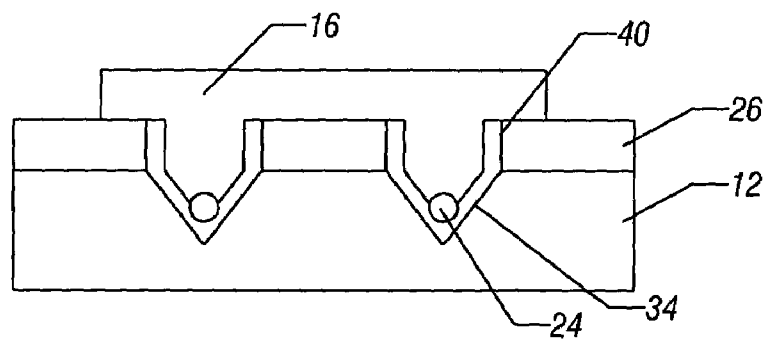
FIG. 3 is a cross-sectional view taken generally along the line 3-3 in FIG. 1.

Moving to FIG. 3, underneath the source/drain metallization or metal pad 16 is the V-groove 34 and the carbon nanotubes 24 shown in FIG. 2. In other words, the carbon nanotubes 24 extend from underneath the source/drain metallization 16 all the way across and under the metal gate electrode 14. The metallization 16 extends all the way into the V-groove 34 and makes contact with the carbon nanotubes 24 as shown in FIG. 3.

Figure 4:
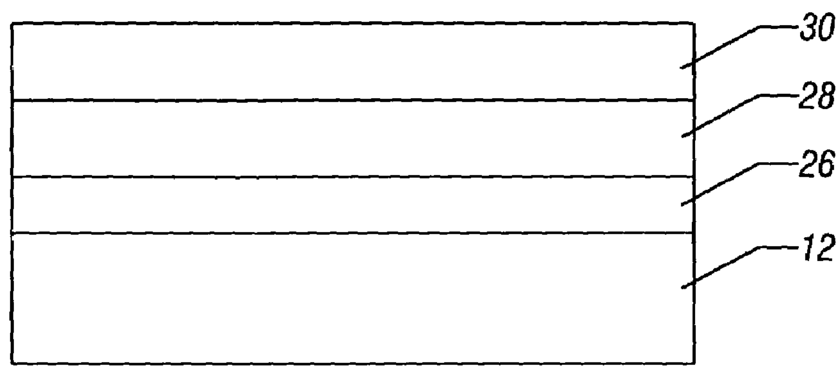
FIG. 4 is a cross-sectional view taken generally along the line 3-3 but at an early stage of manufacture in accordance with one embodiment of the present invention.

Referring to FIG. 4, the method of manufacturing the structure shown in FIGS. 1-3 begins by forming a p-type substrate 12. The p-type substrate may include heavily doped epitaxial p-type silicon on a heavily doped p-type silicon bulk substrate. The heavily doped p-type epitaxial layer reduces polysilicon depletion effects for the formation of a back gate to be described hereafter. Over the substrate 12 is the dielectric material 26, a layer of SiOF 28 and an isolation nitride layer 30 in one embodiment.

The substrate 12 may be a <100> crystallographic orientation substrate to enable the width and the depth of the V-grooves 34 to be controlled. Using a pure <100> silicon wafer, 70 Angstroms of thermal oxide may be grown to form the material 26. Then, 900 Angstroms of an isolation nitride, such as silicon nitride, may be grown on top of the material 26 to form the layer 30.

Figure 5:
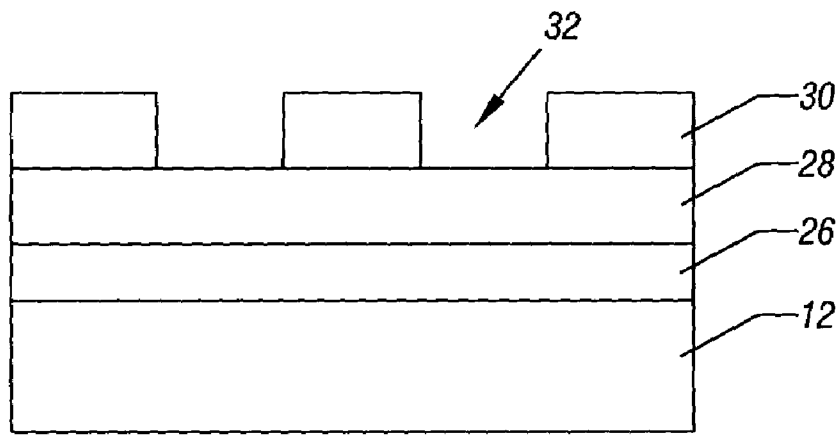
FIG. 5 is a cross-sectional view corresponding to FIG. 4 at a subsequent stage of manufacture in accordance with one embodiment of the present invention.

Then, in FIG. 5, the isolation layer 30 may be patterned using resist to enable the etching of the grooves 34. Thus, the resist may be patterned to act as a mask for etching of the isolation nitride layer 30 and the formation of the apertures 32 therein.

Figure 6:
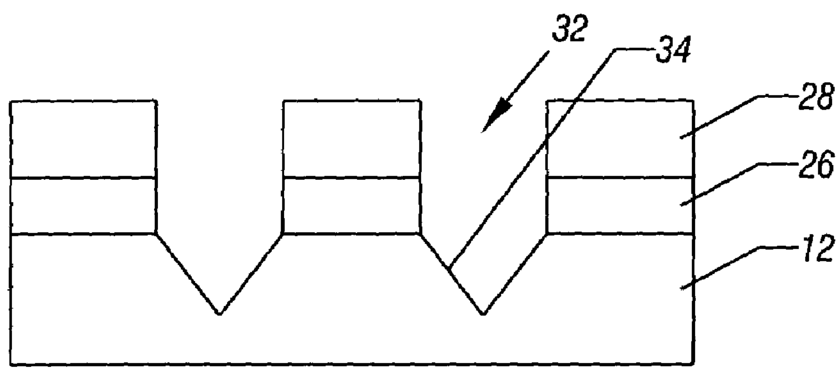
FIG. 6 is a cross-sectional view corresponding to FIG. 5 at a subsequent stage of manufacture in accordance with one embodiment of the present invention.

Then, the isolation nitride layer 30 blocks may be used as a mask to etch through the SiOF layer 28 and the dielectric layer 26 and to form the V-grooves 34 in the substrate 12 as shown in FIG. 6. A subsequent etching process removes the isolation nitride 30 as described below.

The isolation nitride layer 30 may be dry etched selectively to the SiOF 28. A 1% hydrofluoric acid solution may be utilized at 24° C. for 75 seconds to etch the material 26 with minimal undercut of layer 30. Then, phosphoric acid at 160° C., 88%, for 25 minutes may be utilized to remove the nitride layer 30. This leaves 70 Angstroms of patterned silicon dioxide material 26 atop virgin silicon substrate 12.

A very mild hydroxide can be used to create the V-grooves 34. For example, 0.1 to 2% ammonium hydroxide at 24° C. may be utilized with gentle sonic energy. For example, the sonic energy power may be from 0.5 to 1 W/cm$^2$. The substrate 12 will only form a V-groove the width of the opening 32 in the layer 26 and does not undercut, so tight control may be achieved.

Figure 7:
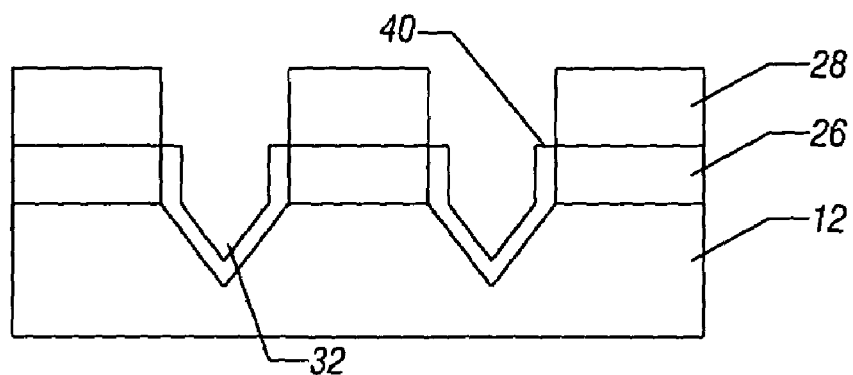
FIG. 7 is a cross-sectional view corresponding to FIG. 6 at a subsequent stage of manufacture in accordance with one embodiment of the present invention.

Referring to FIG. 7, a dielectric layer 40 may then be deposited in the V-grooves 34. The dielectric layer 40 acts as the back gate dielectric. It does not grow on the SiOF 28. The layer 40 may have a dielectric constant greater than ten.

Figure 8:
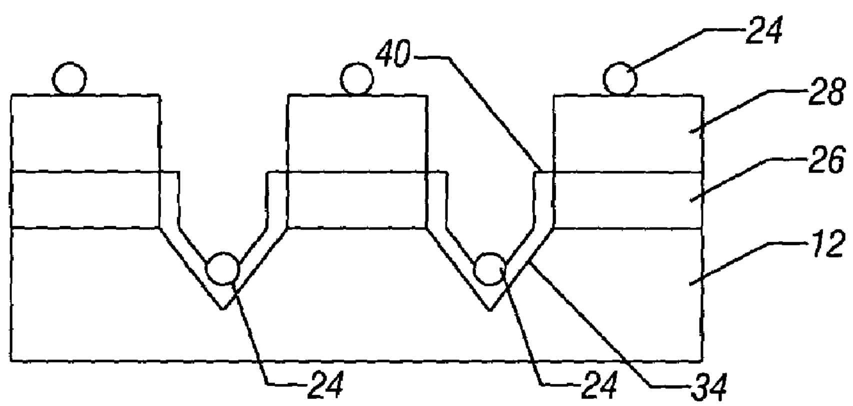
FIG. 8 is a cross-sectional view corresponding to FIG. 7 at a subsequent stage of manufacture in accordance with one embodiment of the present invention.

Next, the nanotubes, such as carbon nanotubes 24, may be deposited as shown in FIG. 8. These nanotubes 24 may be blanket deposited so that some land on top of the SiOF layer 28 and others fall into the V-grooves 34, where they funnel down to sit on top of the dielectric layer 40. If a sufficient density of carbon nanotubes 24 are deposited, any number of V-grooves 34 will be filled with carbon nanotubes 24.

The carbon nanotubes 24 in the V-grooves 34 are held by van der Waals forces within the V-grooves 34. Then, carbon nanotubes that do not find their way into the V-grooves are not so held and are easily removed.

The V-grooves 34 may have nanometer dimensions so that no more than one carbon nanotube can fit into each V-groove in some embodiments. In some embodiments, the V-grooves 34 may have 45° slanted sidewalls. For example, with carbon nanotubes having a diameter between 1.4 and 2 nanometers, the maximum width of the V-groove may be on the order of 3.5 to 5 nanometers. Slightly wider V-grooves 34 may be acceptable because the second carbon nanotube that may try to get into a groove 34 with one carbon nanotube already present will not contact the dielectric layer 40 at two locations and, therefore, will be exposed to lower Van der Waals forces. As a result, the second or subsequent carbon nanotube will get dislodged during the carbon nanotube spin-on process, leaving only the first carbon nanotube that touches both sidewalls of the dielectric layer 40 in the V-groove 34.

Figure 9:
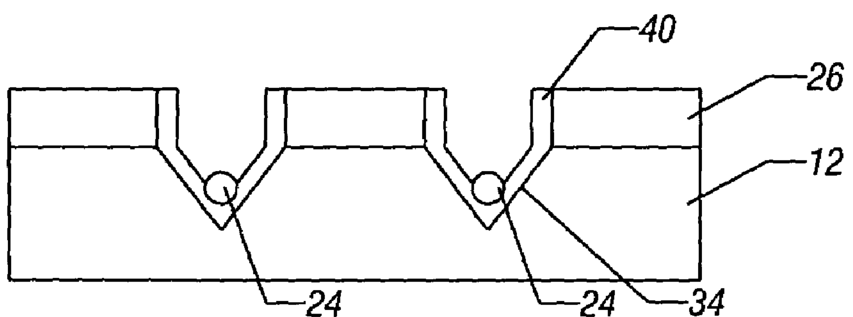
FIG. 9 is a cross-sectional view corresponding to FIG. 8 at a subsequent stage of manufacture in accordance with one embodiment of the present invention.

Thus, as shown in FIG. 9, the material 28 is etched away, lifting off the excess carbon nanotubes, leaving only the carbon nanotubes 24 at the bottom of the V-grooves 34.

Figure 10:
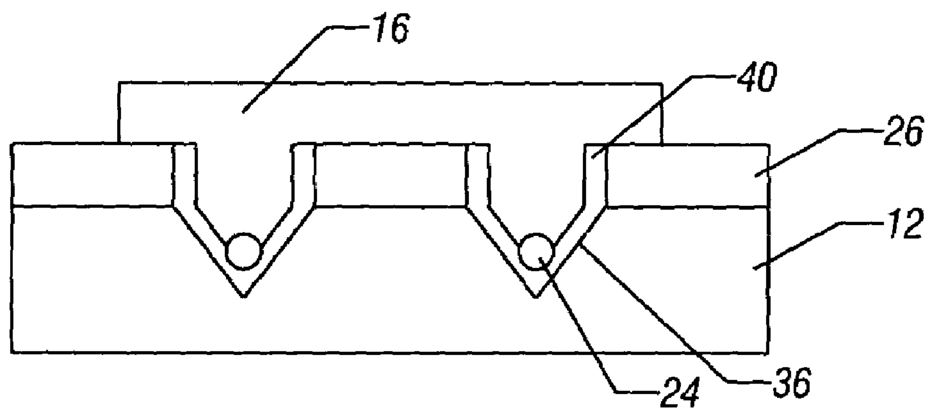
FIG. 10 is a cross-sectional view corresponding to FIG. 9 at a subsequent stage of manufacture in accordance with one embodiment of the present invention.

Then, the source/drain metallization 16 may be deposited and patterned as shown in FIG. 10, which shows the region underneath the source/drain metallization 16. The metallization 16 extends down to the underlying V-grooves 34 and contacts the carbon nanotubes 24. As shown in FIG. 1, the source/drain metallizations 16 are in the form of two stripes spaced away from and on either side of the metal gate 14.

Figure 11:
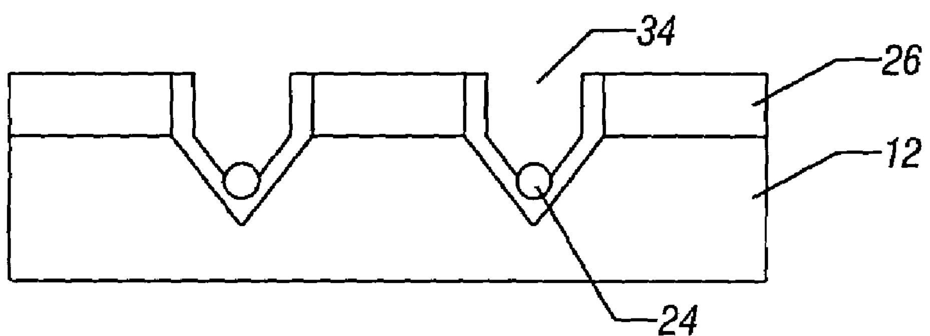
FIG. 11 is a cross-sectional view taken generally along the line 2-2 at the stage of manufacture shown in FIG. 10 in accordance with one embodiment of the present invention.

Referring to FIG. 11, which shows the region underneath the metal gate 14 at the stage also shown in FIG. 10, the source/drain metallization 16 are spaced away from the region that will receive the gate electrode.

Figure 12:
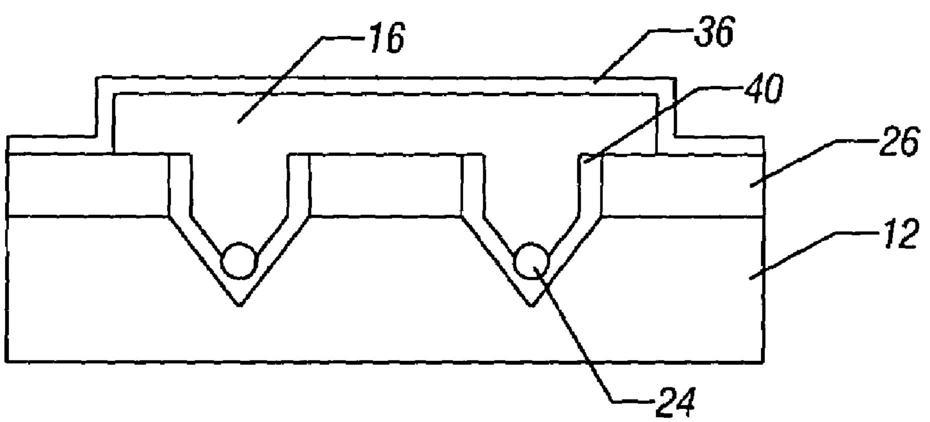
FIG. 12 is a cross-sectional view taken generally along the line 3-3 in FIG. 1 at an early stage of manufacture subsequent to the stage shown in FIG. 10 in accordance with one embodiment of the present invention.

Continuing with the structure (FIG. 10) associated with the source/drain metallization 16, an additional high dielectric constant layer 36 is coated on top of the entire wafer. This layer 36 covers the source/drain metallizations 16 as shown in FIG. 12. This layer 36 acts as a top gate dielectric, and therefore, is thin in order to obtain high front gate capacitance, and hence, high transistor drive current.

Figure 13:
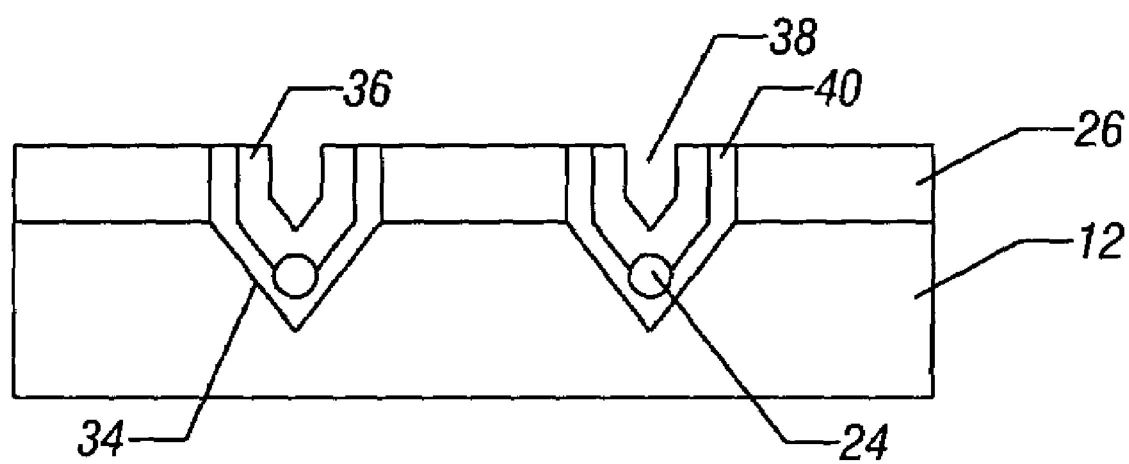
FIG. 13 is a cross-sectional view taken generally along the line 2-2 and corresponding to FIG. 11 but at a subsequent stage of manufacture in accordance with one embodiment of the present invention.

Turning again to the region under the gate metallization shown in FIG. 13, the dielectric 36 fills into the V-grooves 34 because the V-grooves 34 under the gate metallizations do not have the source/drain metallization 16.

Then, referring to FIG. 2, the metal gate electrode 14 may be deposited and patterned so that it extends down into the openings 38 as indicated at 20.

As a result of the use of multiple carbon nanotubes in an array within the transistor 10, the drive current may be increased. A top gate (not shown) then mounts on the metal gate 14 and a back gate (not shown) mounts on the substrate 12. High dielectric constant dielectrics are used as the top and back gate dielectrics 36, 40 in some embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A nanotube transistor comprising: a source and drain; a metal gate electrode; a channel between the gate electrode and the source and drain formed of at least two nanotubes; and a pair of V-shaped trenches formed in a semiconductor substrate, each of said trenches including one nanotube, said V-shaped trenches having walls that are lined by an insulating material, said V-shaped trenches having a width approximately twice the diameter of said nanotubes, said V-shaped trenches are lined with a dielectric layer having a dielectric constant greater than ten, wherein said V-shaped trenches include a dielectric material formed in said V-shaped trenches over said nanotubes, said metal gate electrode extending into said V-shaped trenches.

2. The transistor of claim 1 wherein said nanotubes are parallel carbon nanotubes.

3. The transistor of claim 1 wherein said V-shaped trenches have 45° slanted walls.

4. The transistor of claim 1 wherein said transistor includes source/drain contacts which extend down to and contact said nanotubes.

* * * * *